United States Patent
Lee et al.

(10) Patent No.: US 9,548,354 B1
(45) Date of Patent: Jan. 17, 2017

(54) SEMICONDUCTOR DEVICES AND METHODS FOR FABRICATING THE SAME

(71) Applicant: Vanguard International Semiconductor Corporation, Hsinchu (TW)

(72) Inventors: Chia-Hao Lee, New Taipei (TW); Po-Heng Lin, New Taipei (TW); Chih-Cherng Liao, Jhudong Township, Hsinchu County (TW); Jun-Wei Chen, Hsinchu (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 14/972,860

(22) Filed: Dec. 17, 2015

(51) Int. Cl.
*H01L 29/06* (2006.01)
*H01L 29/49* (2006.01)
*H01L 21/266* (2006.01)
*H01L 29/66* (2006.01)
*H01L 29/78* (2006.01)

(52) U.S. Cl.
CPC .......... *H01L 29/063* (2013.01); *H01L 21/266* (2013.01); *H01L 29/4916* (2013.01); *H01L 29/66666* (2013.01); *H01L 29/7813* (2013.01)

(58) Field of Classification Search
CPC .............................. H01L 29/063; H01L 21/00
See application file for complete search history.

(56) References Cited

U.S. PATENT DOCUMENTS

| | | | |
|---|---|---|---|
| 9,263,560 B2* | 2/2016 | Park | H01L 29/7397 |
| 2002/0019111 A1* | 2/2002 | Pernyeszi | H01L 21/761 |
| | | | 438/400 |
| 2010/0314659 A1* | 12/2010 | Yilmaz | H01L 29/063 |
| | | | 257/139 |
| 2012/0175699 A1* | 7/2012 | Hsieh | H01L 29/1095 |
| | | | 257/332 |
| 2012/0175700 A1* | 7/2012 | Hsieh | H01L 29/0692 |
| | | | 257/334 |
| 2013/0292761 A1* | 11/2013 | Yeh | H01L 29/407 |
| | | | 257/334 |
| 2014/0048872 A1* | 2/2014 | Hsieh | H01L 29/7827 |
| | | | 257/331 |
| 2014/0124774 A1* | 5/2014 | Liu | H01L 29/7835 |
| | | | 257/43 |

(Continued)

FOREIGN PATENT DOCUMENTS

TW 200300607 A 6/2003
TW I223448 B 11/2004
(Continued)

*Primary Examiner* — Charles Garber
*Assistant Examiner* — S. M. S Imtiaz
(74) *Attorney, Agent, or Firm* — Birch, Stewart, Kolasch & Birch, LLP (57) ABSTRACT

A semiconductor device is provided. The semiconductor device includes a substrate having a first conductivity type. An epitaxial layer having the first conductivity type is disposed on the substrate, and a trench is formed in the epitaxial layer. A polysilicon layer having the first conductivity type fills the trench, and a first doping region having a second conductivity type that is different from the first conductivity type is disposed in the epitaxial layer and on sidewalls of the trench. A method for forming the semiconductor device is also provided.

17 Claims, 10 Drawing Sheets

(56) References Cited

U.S. PATENT DOCUMENTS

2014/0353747 A1* 12/2014 Cheng ............... H01L 29/66727
257/334

FOREIGN PATENT DOCUMENTS

| TW | 201027745 A1 | 7/2010 |
| TW | 201131741 A1 | 9/2011 |
| TW | 201318072 A1 | 5/2013 |

* cited by examiner

SEMICONDUCTOR DEVICES AND METHODS FOR FABRICATING THE SAME

BACKGROUND

Field of the Invention

The present invention relates to semiconductor devices, and in particular to trench metal oxide semiconductor field effect transistors (Trench MOSFETs) and methods for fabricating the same.

Description of the Related Art

Technology that includes high-voltage elements is implemented into integrated circuits with high voltages and high power. In order to achieve a high-withstand voltage and high current, the flow of the driving current in a conventional power transistor has been developed from a horizontal direction to a vertical direction. A metal oxide semiconductor field-effect transistor (MOSFET) having a trench gate has been developed that is capable of effectively reducing on-resistance (Ron) and processing high currents.

In recent years, the Trench MOSFET has seen significant development in the field of computers and consumer electronics. Currently, the technology used in the Trench MOSFET has been widely accepted, and the Trench MOSFET has a high market share. However, there are still many improvements that are required in term of the Trench MOSFET's capability to exhibit a high-withstand voltage.

Therefore, it is necessary to search for Trench MOSFET devices and methods for fabricating the same that can improve upon or solve the above problems.

BRIEF SUMMARY

According to some embodiments of the disclosure, a semiconductor device is provided. The semiconductor device includes a substrate having a first conductivity type. An epitaxial layer having the first conductivity type is disposed on the substrate and has a trench therein. A polysilicon layer fills the trench and has the first conductivity type. A first doping region is disposed in the epitaxial layer and is located on sidewalls of the trench and has a second conductivity type that is different from the first conductivity type.

According to some embodiments of the disclosure, a method for fabricating a semiconductor device is provided. The method includes providing a substrate having a first conductivity type, forming an epitaxial layer having the first conductivity type on the substrate, and forming a patterned mask having a first opening on the epitaxial layer. The method also includes performing an ion implantation process on the epitaxial layer through the first opening to form a first doping region having a second conductivity type in the epitaxial layer, wherein the second conductivity type is different from the first conductivity type. The method also includes, after forming the first doping region, performing an etching process on the epitaxial layer through the first opening to form a trench in the epitaxial layer and the first doping region, wherein a remaining portion of the first doping region is located on sidewalls of the trench. Furthermore, the method includes filling a polysilicon layer having the first conductivity type into the trench.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of a mode for carrying out the invention. This description is made for the purpose of illustrating the general principles of the invention and should not be taken in a limiting sense. The scope of the invention is best determined by reference to the appended claims. Moreover, the same or similar elements in the drawings and the description are labeled with the same reference numbers.

Figure 1:
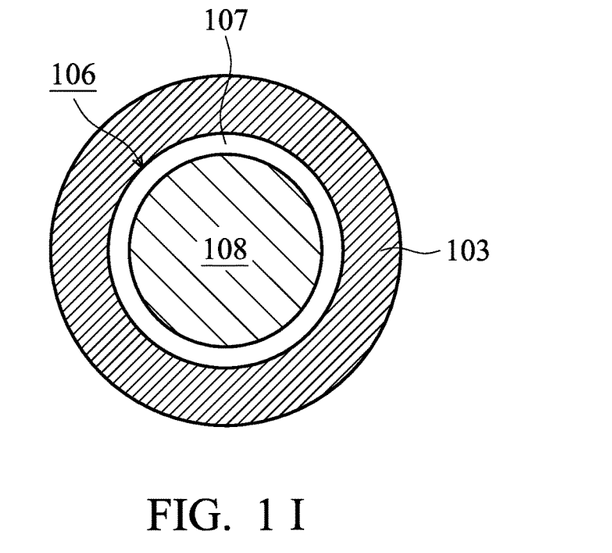
FIGS. 1A-1H shows cross-sectional views of various stages of a method of fabricating a semiconductor device according to some embodiments of the disclosure.
FIGS. 1I-1J shows plane views along the line I-I' shown in FIG. 1H, according to some embodiments of the disclosure.
Figure 1A:
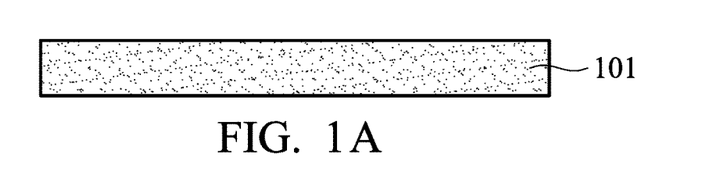
Figure 1B:
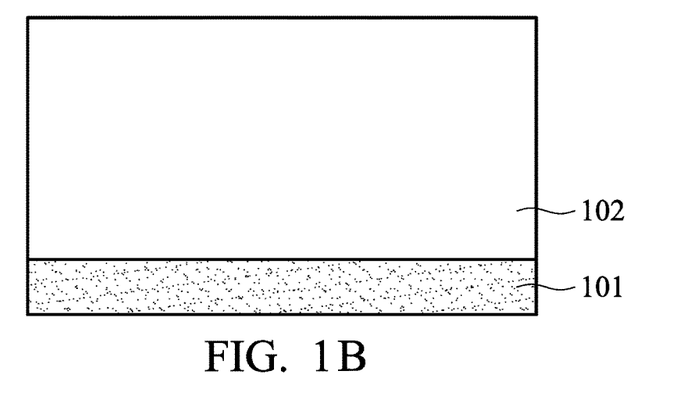
Figure 1C:
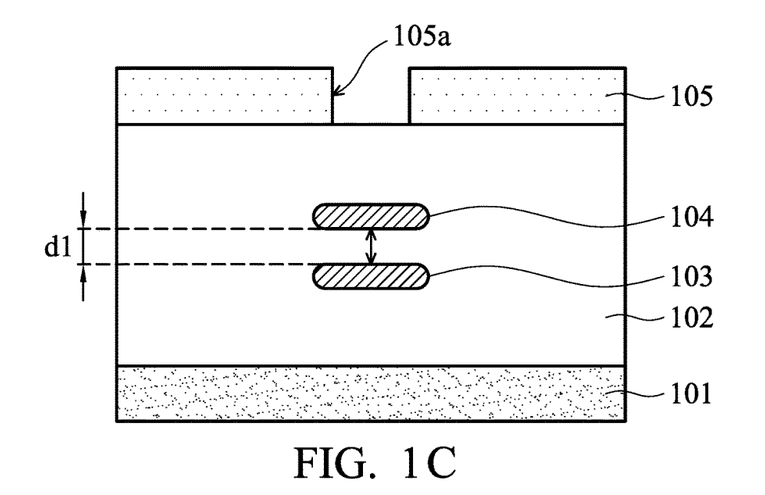
Figure 1D:
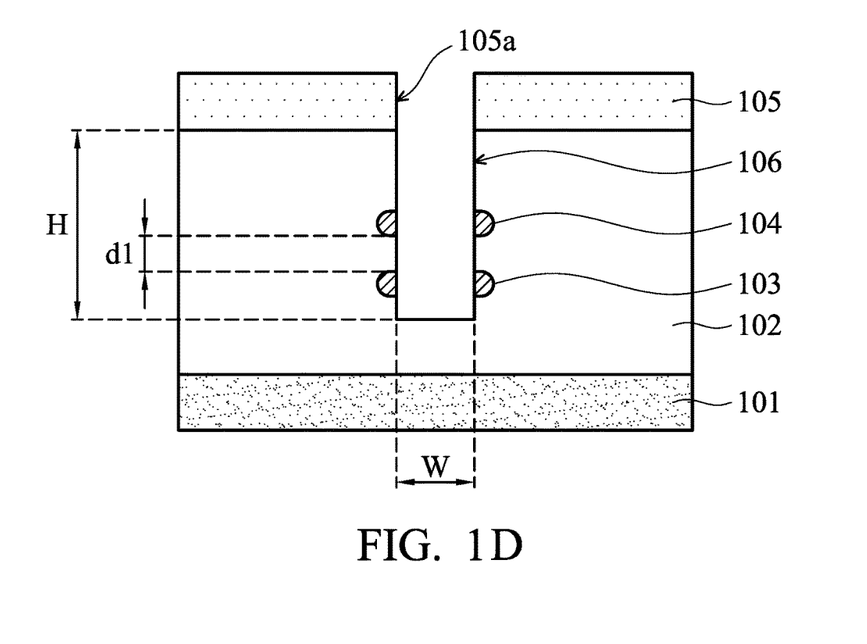
Figure 1E:
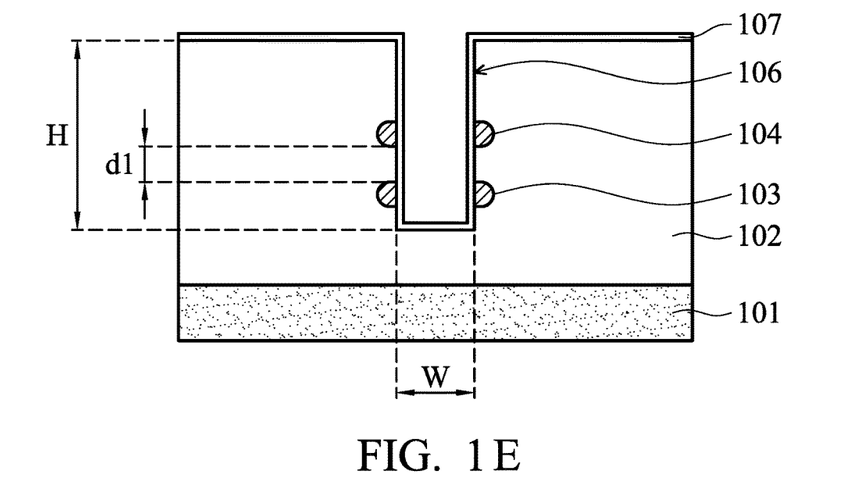
Figure 1F:
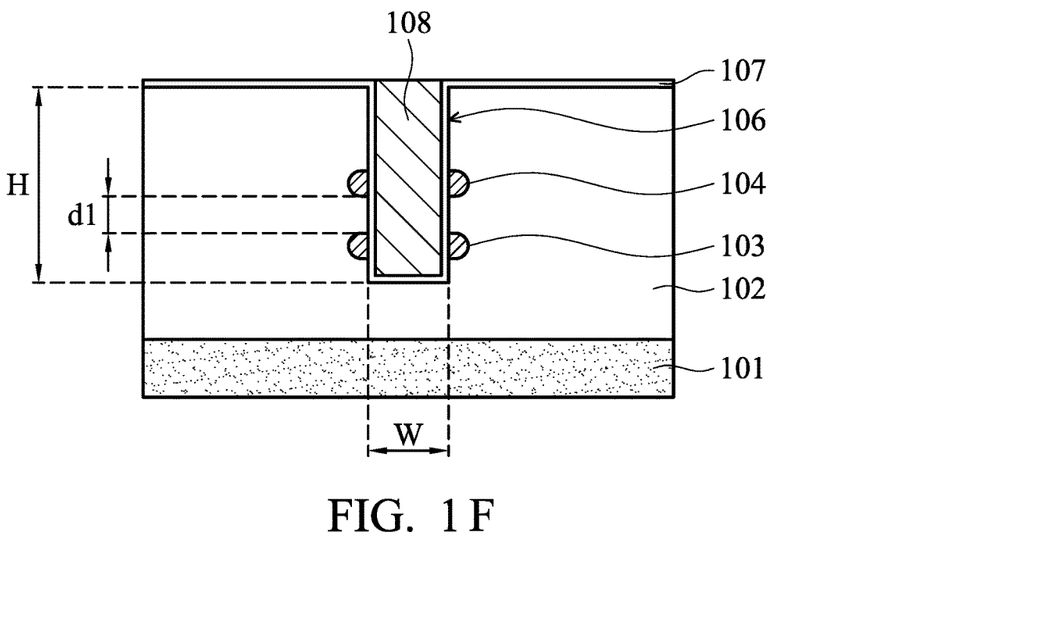
Figure 1G:
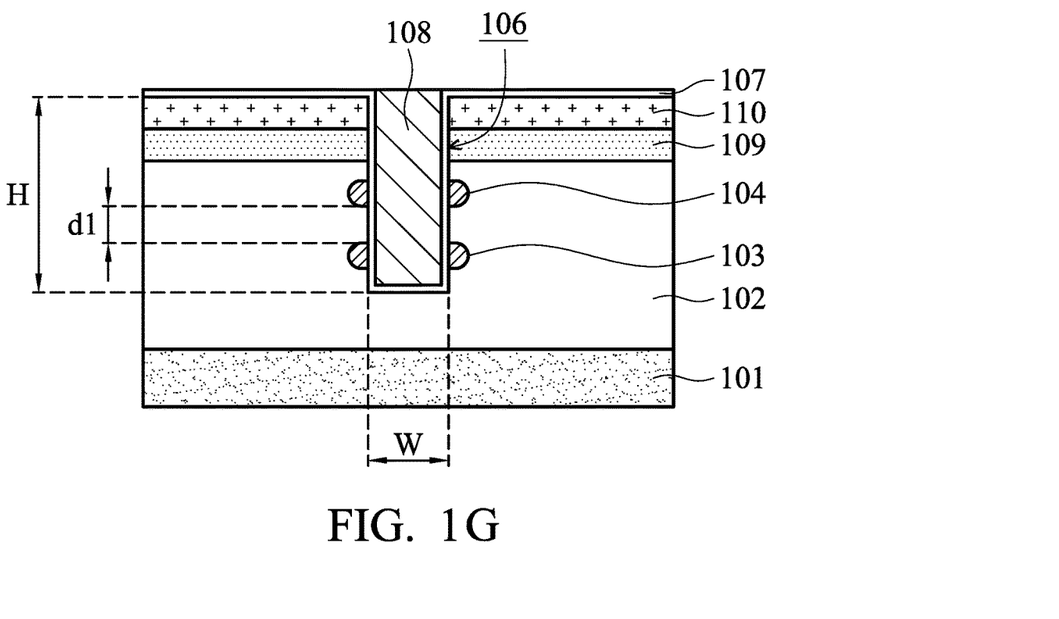
Figure 1H:
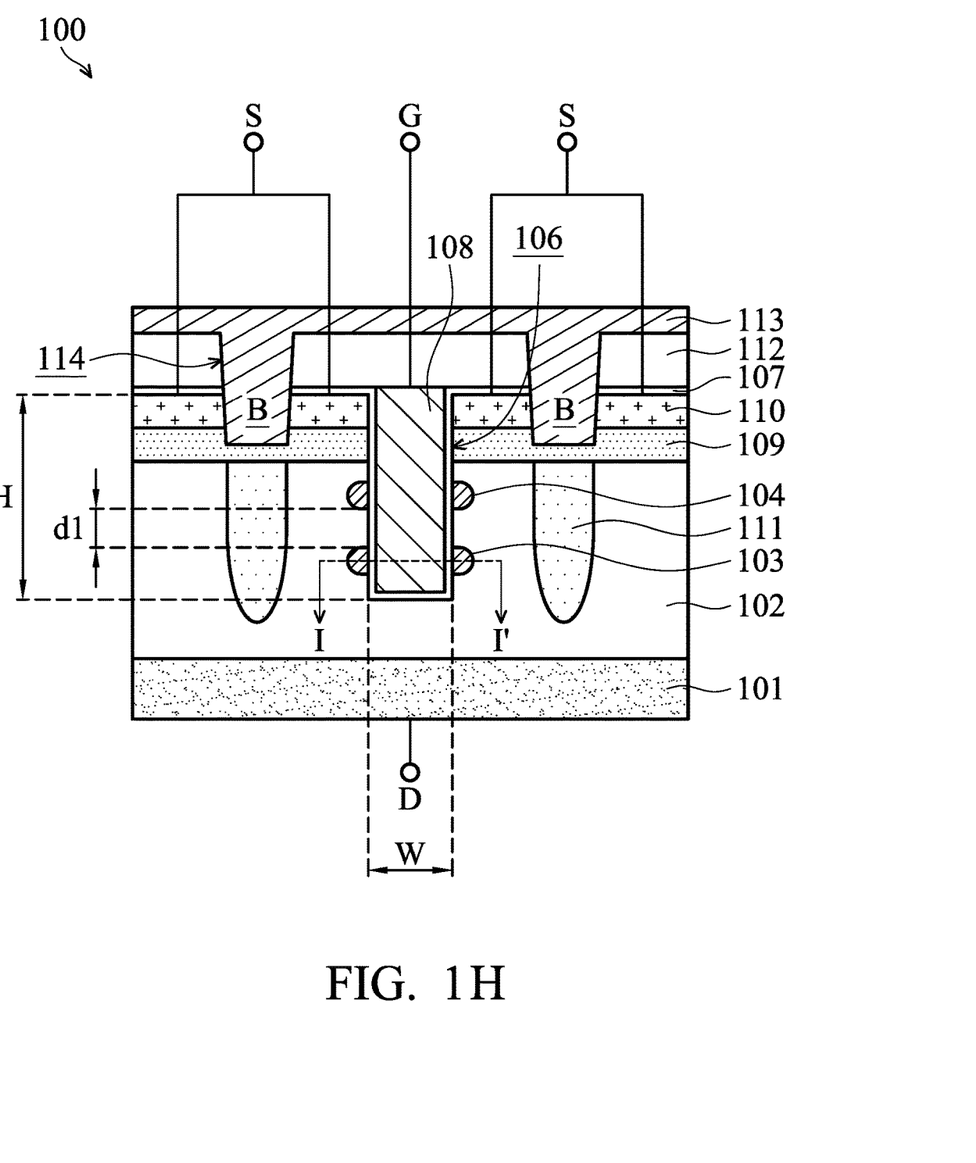

FIG. 1H shows a cross-sectional view of a semiconductor device 100 having a Trench MOSFET according to some embodiments of the disclosure. However, the embodiments of the disclosure should not be limited to any specific application. The semiconductor device 100 includes a substrate 101. The substrate 101 has a first conductivity type and acts as a drain (D) of the semiconductor device 100. In some embodiments, the substrate 101 may be a single crystal silicon substrate, an epitaxial silicon substrate, a silicon germanium substrate, a compound semiconductor substrate, or another suitable substrate. In the embodiment, the first conductivity type is n-type, but it is not limited thereto. In other embodiments, the first conductivity type is p-type, and the first conductivity type may be determined according to the demands of a particular design.

In some embodiments, the semiconductor device 100 includes an epitaxial layer 102. The epitaxial layer 102 has the first conductivity type, which is the same as the conductivity type of the substrate 101 and is disposed on the substrate 101, and the epitaxial layer 102 has a trench 106 formed therein. In the embodiment, the trench 106 has a depth H of about 0.8 µm and a width W of about 0.4 µm, but it is not limited thereto. The depth and the width of the trench 106 may be determined according to the demands of a particular design. A polysilicon layer 107 fills in the trench 106 and has the first conductivity type, which is the same as the conductivity type of the substrate 101, and the polysilicon layer 107 acts as a trench gate (G) of the semiconductor device 100.

In the embodiment, a first doping region 103 is disposed in the epitaxial layer 102 and is located on two opposite sidewalls of the trench 106, and the first doping region 103 has a second conductivity type that is different from the conductivity type of the substrate 101. FIGS. 1I-1J show plane views along the line I-I' shown in FIG. 1H, according to some embodiments of the disclosure. In some embodiments, as shown in FIG. 1I, the first doping region 103 is an annular region surrounding the trench 106. The size and shape of the annular region shown in FIG. 1I is only an example of the embodiments, but it is not limited thereto. The size and shape of the annular region may be determined according to the demands of a particular design. In some embodiments, as shown in FIG. 1J, the first doping region 103 is two doping regions located on two opposite sidewalls of the trench 106.

In the embodiment, the second conductivity type is p-type. The p-type first doping region 103 may include a p-type dopant (for example, B or BF3), but it is not limited thereto. In some other embodiments, the second conductivity type may be n-type. The n-type first doping region 103 may include a n-type dopant (for example, P or As), and the conductivity type of the first doping region 103 may be determined according to the demands of a particular design.

Since the first doping region 103 is disposed in the epitaxial layer 102 and has the second conductivity type, which is different from the conductivity type of the substrate 101 and the epitaxial layer 102, the charge of two different conductivity types is balanced in the epitaxial layer 102, and further make a semiconductor device 100 with a Trench MOSFET, to achieve a high breakdown voltage (BV). In other words, the first doping region 103 improves the withstand voltage of the semiconductor device 100.

In some embodiments, the semiconductor device 100 also includes a second doping region 104 disposed in the epitaxial layer 102 and located on two opposite sidewalls of the trench 106. The second doping region 104 is located over the first doping region 103, and the second doping region 104 is separated from the first doping region 103 by a distance d1. In some embodiments, the second doping region 104 can be an annular region surrounding the trench 106 like the first doping region 103 shown in FIG. 1I. In some embodiments, the second doping region 104 can be two doping regions located on two opposite sidewalls of the trench 106 like the first doping region 103 shown in FIG. 1J.

In some embodiments, the second doping region 104 can have the second conductivity type, which is the same as the conductivity type of the first doping region 103. The second doping region 104 and the first doping region 103 can also have the same dopants, the same doping concentration and the same doping area, but it is not limited thereto. In some other embodiments, the second doping region 104 can have the first conductivity type, which is different from the conductivity type of the first doping region 103. The second doping region 104 and the first doping region 103 can also have different dopants, different doping concentrations and different doping areas. It should be understood that the shapes of the first doping region 103 and the second doping region 104 of the semiconductor device 100 are only an example of the embodiments, but it is not limited thereto. The shapes of the first doping region 103 and the second doping region 104 may be determined according to the demands of a particular design.

The semiconductor device 100 also includes a well region 109 and a heavily doped region 110. The well region 109 is disposed on the epitaxial layer 102 and located over the first doping region 103 and the second doping region 104, and the well region 109 has the second conductivity type, which is different from the conductivity type of the substrate 101. The well region 109 acts as a channel region of the semiconductor device 100.

Since the well region 109 acts as the channel region has the second conductivity type, and the well region 109 is located over the second doping region 104, in some embodiments, the length of the channel region is increased while the second doping region 104 has the second conductivity type, which is the same as the conductivity type of the well region 109 and is near the well region 109. In some other embodiments, the length of the channel region is decreased while the second doping region 104 has the first conductivity type, which is different from the conductivity type of the well region 109 and is near the well region 109. And since the length of the channel region is proportional to the drain-source on-state resistance (Rdson) of the Trench MOSFET of the semiconductor device 100, thereby the Rdson of the Trench MOSFET is decreased further. Therefore, by adjusting the conductivity type and disposition of the second doping region 104, the length of the channel region of the Trench MOSFET can be controlled, thereby controlling the Rdson of the Trench MOSFET.

The heavily doped region 110 is disposed on the well region 109 and has the first conductivity type, which is the same as the conductivity type of the substrate 101. The trench 106 extends from the epitaxial layer 102 into the well region 109 and the heavily doped region 110. The heavily doped region 110 acts as a source (S) of the semiconductor device 100. In some embodiments, the doping concentration of the heavily doped region 110 is greater than that of the substrate 101 and the epitaxial layer 102.

In some embodiments, the semiconductor device 100 also includes a reduced surface field (RESURF) doping region 111. The RESURF doping region 111 is disposed in the epitaxial layer 102 and under the well region 109, and the RESURF doping region 111 is separated from the trench 106 and has the second conductivity type, which is different from the conductivity type of the substrate 101. Since the RESURF doping region 111 is disposed in the epitaxial layer 102 and has the second conductivity type, which is different from the conductivity type of the substrate 101 and the epitaxial layer 102, the charges of two different conductivity types are balanced in the epitaxial layer 102, and further make a semiconductor device 100 that has a Trench MOSFET to achieve a high breakdown voltage (BV). In other words, the RESURF doping region 111 improves the withstand voltage of the semiconductor device 100.

In some embodiments, the semiconductor device 100 also includes an oxide liner layer 107. The oxide liner layer 107 is disposed on the heavily doped region 110 and extends onto the sidewalls and the bottom of the trench 106, and the oxide liner layer 107 in the trench 106 is between the polysilicon layer 108 and the first doping region 103, and between the polysilicon layer 108 and the second doping region 104. In some embodiments, the material of the oxide liner layer 107 may include oxide or oxynitride (for example, silicon oxide, silicon oxynitride or a combination thereof) or another suitable insulating material.

In some embodiments, the semiconductor device 100 also includes a dielectric layer 112 and a metal layer 113. The dielectric layer 112 is disposed over the heavily doped region 110 and has an opening 114 corresponding to the RESURF doping region 111, and the opening 114 further extends into the heavily doped region 110 and the well region 109. In some embodiments, the material of the dielectric layer 112 may include inorganic materials (for example, silicon oxide, silicon nitride, silicon oxynitride or a combination thereof), organic materials (for example, epoxy resin, polyimide, butylcyclobutene (BCB), parylene, polynaphthalenes, fluorocarbons or acrylates), or other suitable insulating materials.

The metal layer 113 is disposed on the dielectric layer 112 and fills the opening 114, and the metal layer 113 in the opening 114 acts as a bulk (B) of the semiconductor device 100. In some embodiments, the material of the metal layer 113 may include Cu, Ag, Au, Al, another suitable conductive material, or a combination thereof.

In some embodiments, the polysilicon layer 108 and the heavily doped region 110 are respectively electrically connected to external parts through different via holes (not shown) respectively penetrating the dielectric layer 112 and the oxide liner layer 107 and the metal layer 113 filling in these via holes. The polysilicon layer 108 and the heavily doped region 110 are used as the gate (G) and the source (S) of the semiconductor device 100, respectively.

FIGS. 1A-1H shows cross-sectional views of various stages of a method of fabricating the semiconductor device 100 having a Trench MOSFET according to some embodiments of the disclosure. However, the embodiments of the disclosure should not be limited to any specific application.

In FIGS. 1A-1B, a substrate 101 having a first conductivity type is provided. An epitaxial layer 102 is formed on the substrate 101 through an epitaxial growth process (for example, chemical vapor deposition, liquid phase epitaxy, solid phase epitaxy, molecular beam epitaxy, or another suitable process). The epitaxial layer 102 has the first conductivity type, which is the same as the conductivity type of the substrate 101.

In FIG. 1C, a patterned mask 105 is formed on the epitaxial layer 102 through a lithography patterning process such as photoresist coating (for example, spin-coating), soft baking, mask aligning, exposing, post-exposure baking, photoresist developing, washing and drying (for example, hard baking), another suitable process, or a combination thereof. The patterned mask 105 has a first opening 105a. A doping process (for example, an ion implantation process) is performed on the epitaxial layer 102 through the first opening 105a to form a first doping region 103 in the epitaxial layer 102. The first doping region 103 has a second conductivity type that is different from the conductivity type of the substrate 101.

In some embodiments, after forming the first doping region 103, a second doping region 104 can be formed over the first doping region 103 through another doping process (for example, an ion implantation process) (i.e. the first doping region 103 and the second doping region 104 are formed in two different doping processes). The second doping region 104 is separated from the first doping region 103 by a distance d1. In some embodiments, the second doping region 104 may have the second conductivity type, which is the same as the conductivity type of the first doping region 103. The second doping region 104 and the first doping region 103 can also have the same dopants, the same doping concentration and the same doping area, but it is not limited thereto. In some other embodiments, the second doping region 104 can have the first conductivity type, which is different from the conductivity type of the first doping region 103. The second doping region 104 and the first doping region 103 can also have different dopants, different doping concentrations and different doping areas. It should be understood that the shapes of the doping profiles of the first doping region 103 and the second doping region 104 of the semiconductor device 100 as shown in FIG. 1C are only an example of the embodiments, but it is not limited thereto. The shapes of the actual doping profiles of the first doping region 103 and the second doping region 104 may be determined according to the demands of a particular design.

In FIG. 1D, after the first doping region 103 and the second doping region 104 are formed, an etching process (for example, a dry etch process, wet etch process, plasma etching process, reactive ion etching process, or another suitable process) is performed on the epitaxial layer 102 through the first opening 105a of the patterned mask 105 to form a trench 106 in the epitaxial layer 102, the first doping region 103 and the second doping region 104. The etching process removes a portion of the first doping region 103 and the second doping region 104, and the remaining portion of the first doping region 103 and the second doping region 104 are located on two opposite sidewalls of the trench 106. After forming the trench 106, remove the patterned mask 105. In the embodiment, the trench 106 has a depth H of about 0.8 μm and a width W of about 0.4 μm, but it is not limited thereto. The depth and the width of the trench 106 may be determined according to the demands of a particular design.

Compared to the other fabrication processes of forming a semiconductor device performed by forming a trench in an epitaxial layer at first and then forming a first doping region and a second doping region in the epitaxial layer, in the embodiment of the disclosure, the fabrication processes of forming a semiconductor device 100 are performed by forming the first doping region 103 and a second doping region 104 in the epitaxial layer 102 at first and then forming a trench 106 penetrating the first doping region 103 and the second doping region 104. Therefore, the doping profiles and the doping concentrations of the first doping region 103 and the second doping region 104 in the epitaxial layer 102 are not influenced by the shielding effect of the trench 106, and the doping profiles and the doping concentrations of the first doping region 103 and the second doping region 104 can be distributed evenly on two opposite sidewalls of the trench 106. A better and higher breakdown voltage of the semiconductor device 100 having the Trench MOSFET is thereby achieved.

In the embodiment, since the trench 106 of the Trench MOSFET and the first doping region 103 and the second doping region 104 on two opposite sidewalls of the trench 106 are formed by using one mask in the process, the process of the semiconductor device 100 has a higher process margin.

In FIG. 1E, an oxide liner layer 107 is formed that totally covers the epitaxial layer 102 by a deposition process (for example, physical vapor deposition, chemical vapor deposition or another suitable process), and the oxide liner layer 107 extends onto the sidewalls and the bottom of the trench 106.

In FIG. 1F, a polysilicon layer 108 fills the trench 106 and covers the oxide liner layer 107 using a deposition process (for example, physical vapor deposition, chemical vapor deposition, or another suitable process), a lithography process and an etching process (for example, a dry etch process, wet etch process, plasma etching process, reactive ion etching process or another suitable process). The oxide liner layer 107 in the trench 106 is between the polysilicon layer 108 and the first doping region 103, and between the polysilicon layer 108 and the second doping region 104. The polysilicon layer 108 has the first conductivity type, which is the same as the conductivity type of the substrate 101.

In FIG. 1G, a well region 109 is formed in the epitaxial layer 102 by a doping process (for example, an ion implantation process), and a heavily doped region 110 is formed on the well region 109 by another doping process (for example, an ion implantation process). The trench 106 penetrates the well region 109 and the heavily doped region 110. The well region 109 has the second conductivity type, which is different from the conductivity type of the substrate 101, and the heavily doped region 110 has the first conductivity type, which is the same as the conductivity type of the substrate 101. In some embodiments, the doping concentration of the heavily doped region 110 is greater than that of the substrate 101 and the epitaxial layer 102.

In FIG. 1H, a RESURF doping region 111 is formed by a doping process (for example, an ion implantation process) in the epitaxial layer 102 under the well region 109 and separated from the trench 106, wherein the RESURF doping region 111 has the second conductivity type, which is different from the conductivity type of the substrate 101. The RESURF doping region 111 is a heavily doped region which has a higher doping concentration than those of the well region 109, the first doping region 103 and the second doping region 104.

Then, a dielectric layer 112 is formed over the heavily doped region 110 by a deposition process (for example, physical vapor deposition, chemical vapor deposition, or another suitable process), a lithography process and an etching process (for example, a dry etch process, wet etch process, plasma etching process, reactive ion etching process, or another suitable process), and a second opening 114 is formed in the dielectric layer 112, the oxide liner layer 107, the well region 109 and the heavily doped region 110 corresponding to the location of the RESURF doping region 111. And then, a metal layer 113 is formed on the dielectric layer 112 by a deposition process (for example, physical vapor deposition, chemical vapor deposition, or another suitable process), and the metal layer 113 fills the second opening 114.

Figure 2:
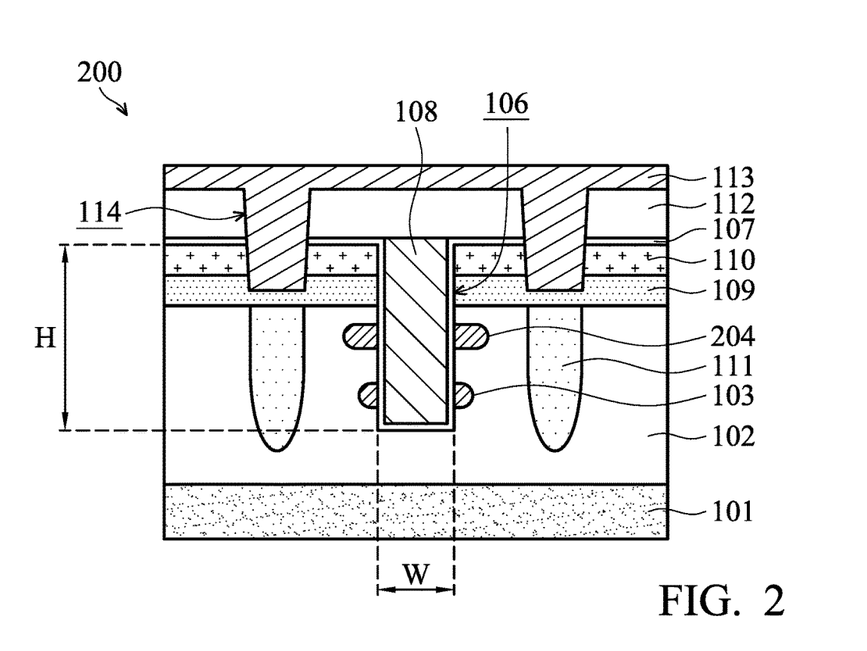
FIG. 2 shows cross-sectional view of a semiconductor device according to some embodiments of the disclosure.

FIG. 2 shows a cross-sectional view of a semiconductor device 200 having a Trench MOSFET according to some embodiments of the disclosure. Elements of the semiconductor device 200 in FIG. 2 that are the same as those in FIG. 1H are labeled with the same reference numbers as in FIG. 1H and are not described again for brevity.

The structure of the semiconductor device 200 shown in FIG. 2 is similar to that of the semiconductor device 100 shown in FIG. 1H. The difference therebetween is that the doping area of the second doping region 204 of the semiconductor device 200 is bigger than that of the first doping region 103. In some other embodiments, the doping area of the second doping region 204 may be smaller than that of the first doping region 103. It should be understood that the shapes of the doping profiles of the first doping region 103 and the second doping region 204 of the semiconductor device 200 as shown in FIG. 2 is only an example of the embodiments, but it is not limited thereto. The shapes of the actual doping profiles of the first doping region 103 and the second doping region 204 may be determined according to the demands of a particular design.

Figure 3:
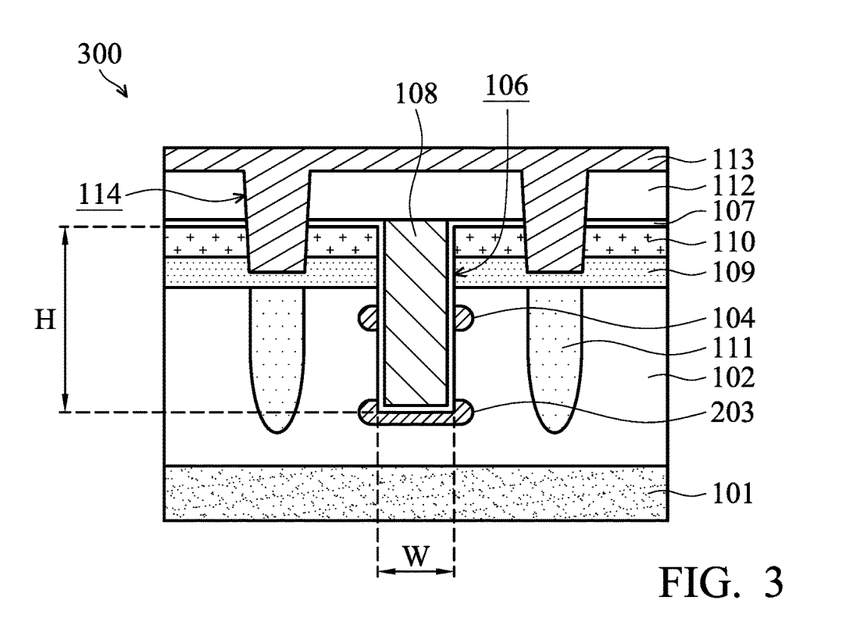
FIG. 3 shows cross-sectional view of a semiconductor device according to some embodiments of the disclosure.

FIG. 3 shows a cross-sectional view of a semiconductor device 300 having a Trench MOSFET according to some embodiments of the disclosure. Elements of the semiconductor device 300 in FIG. 3 that are the same as those in FIG. 1H are labeled with the same reference numbers as in FIG. 1H and are not described again for brevity.

The structure of the semiconductor device 300 shown in FIG. 3 is similar to that of the semiconductor device 100 shown in FIG. 1H. The difference therebetween is that the first doping region 203 of the semiconductor device 300 surrounds and wraps the bottom of the trench 106. It should be understood that the shapes of the doping profiles of the first doping region 203 and the second doping region 104 of the semiconductor device 300 as shown in FIG. 3 is only an example of the embodiments, but it is not limited thereto. The shapes of the actual doping profiles of the first doping region 203 and the second doping region 104 may be determined according to the demands of a particular design.

Figure 4:
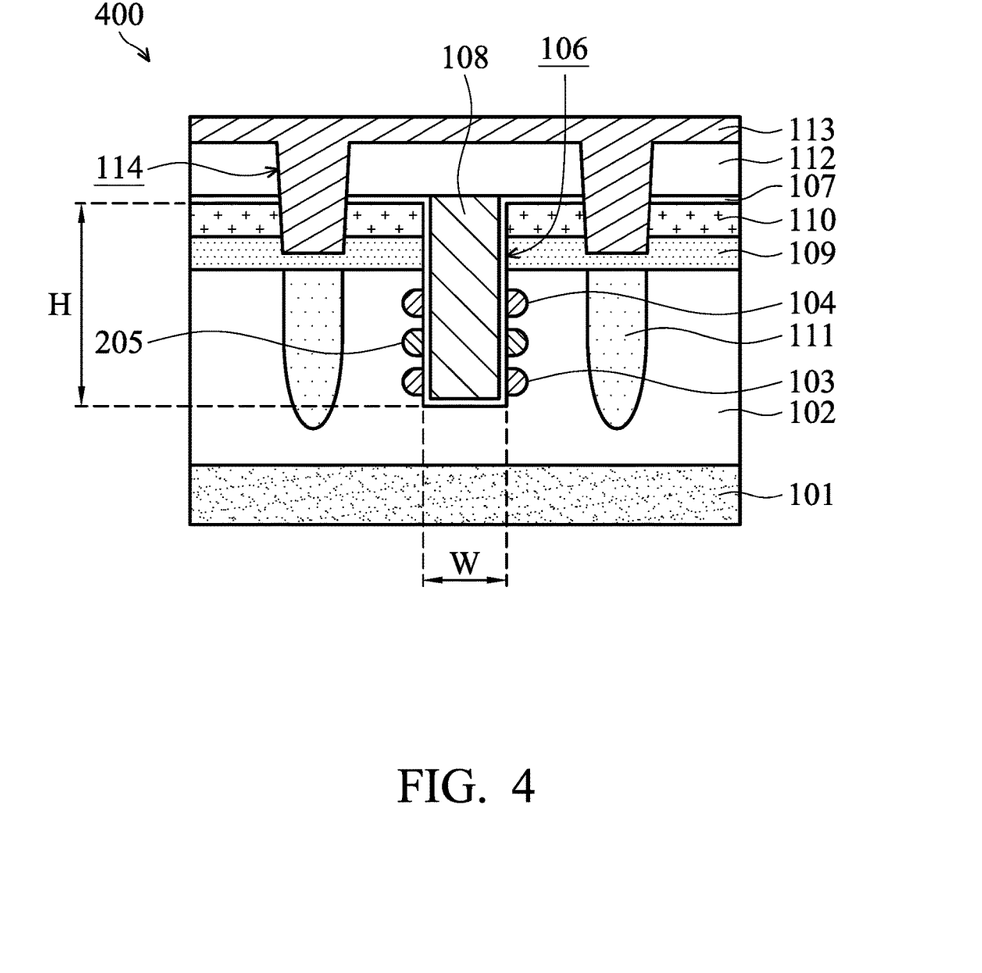
FIG. 4 shows cross-sectional view of a semiconductor device according to some embodiments of the disclosure.

FIG. 4 shows a cross-sectional view of a semiconductor device 400 having a Trench MOSFET according to some embodiments of the disclosure. Elements of the semiconductor device 400 in FIG. 4 that are the same as those in FIG. 1H are labeled with the same reference numbers as in FIG. 1H and are not described again for brevity.

The structure of the semiconductor device 400 shown in FIG. 4 is similar to that of the semiconductor device 100 shown in FIG. 1H. The difference therebetween is that the semiconductor device 400 also includes a third doping region 205 disposed in the epitaxial layer 102 and located on two opposite sidewalls of the trench 106, and the third doping region 205 is located between the first doping region 103 and the second doping region 104. In some embodiments, the third doping region 205 has a conductivity type that is different from the conductivity type of the first doping region 103 and the second doping region 104, but it is not limited thereto. In some other embodiments, the third doping region 205 has a conductivity type that is the same as the conductivity type of the first doping region 103 and the second doping region 104.

Figure 5:
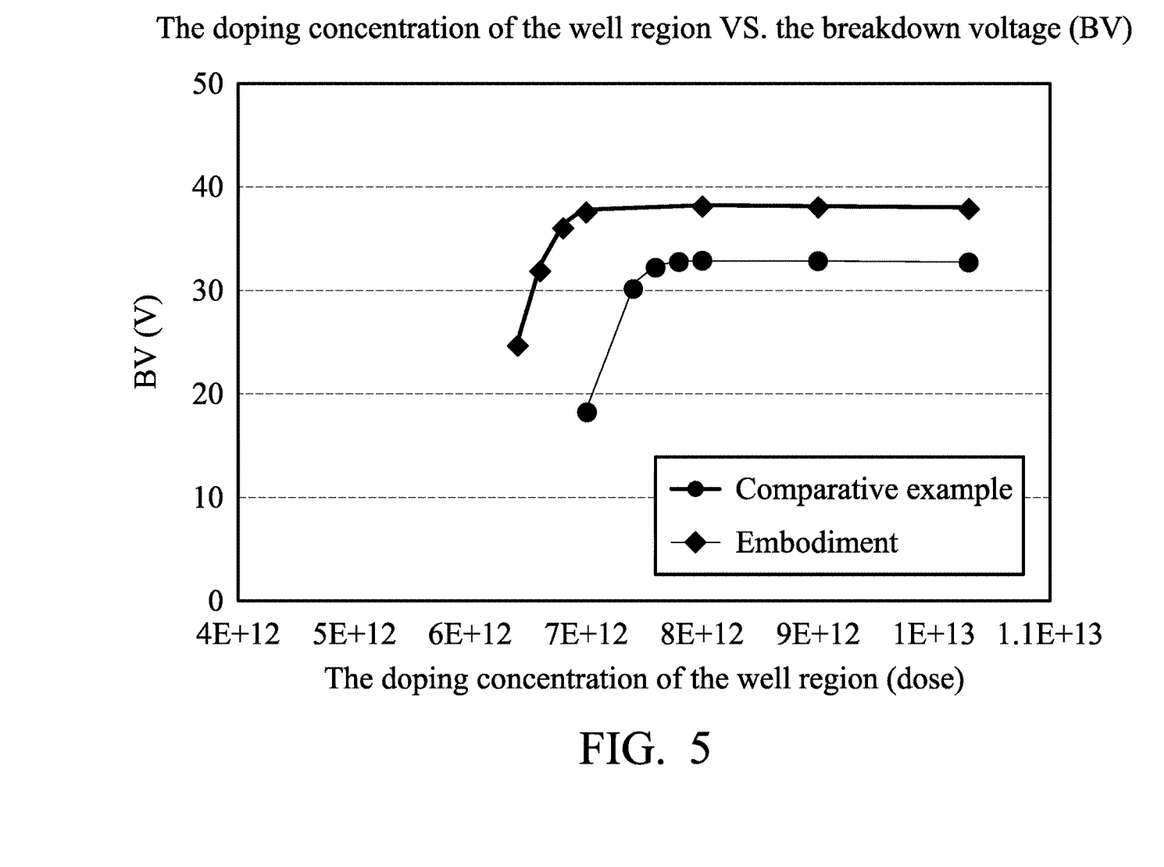
FIG. 5 shows an electrical test chart of a semiconductor device according to some embodiments of the disclosure.
Figure 6:
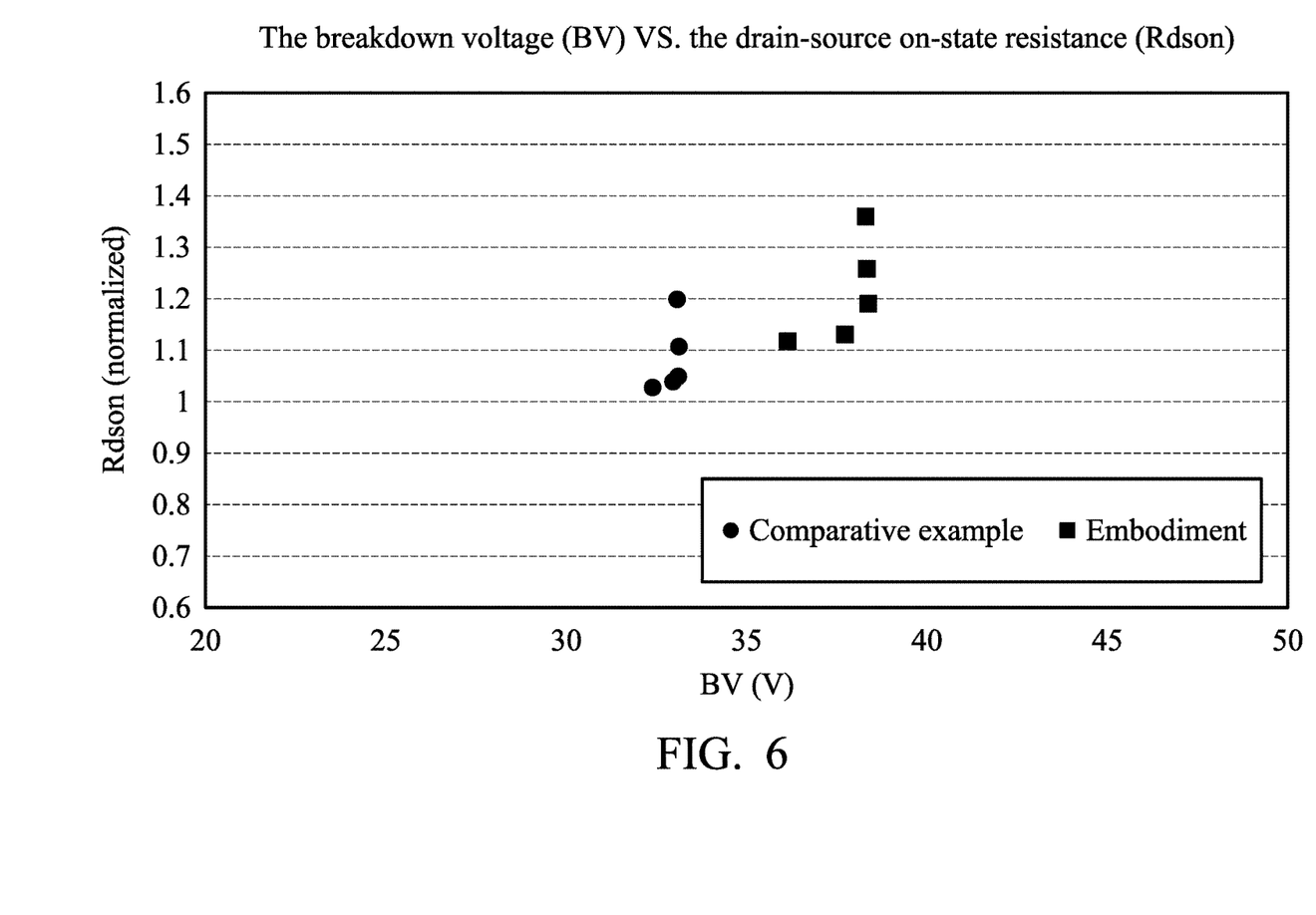
FIG. 6 shows another electrical test chart of a semiconductor device according to some embodiments of the disclosure.
Figure 7:
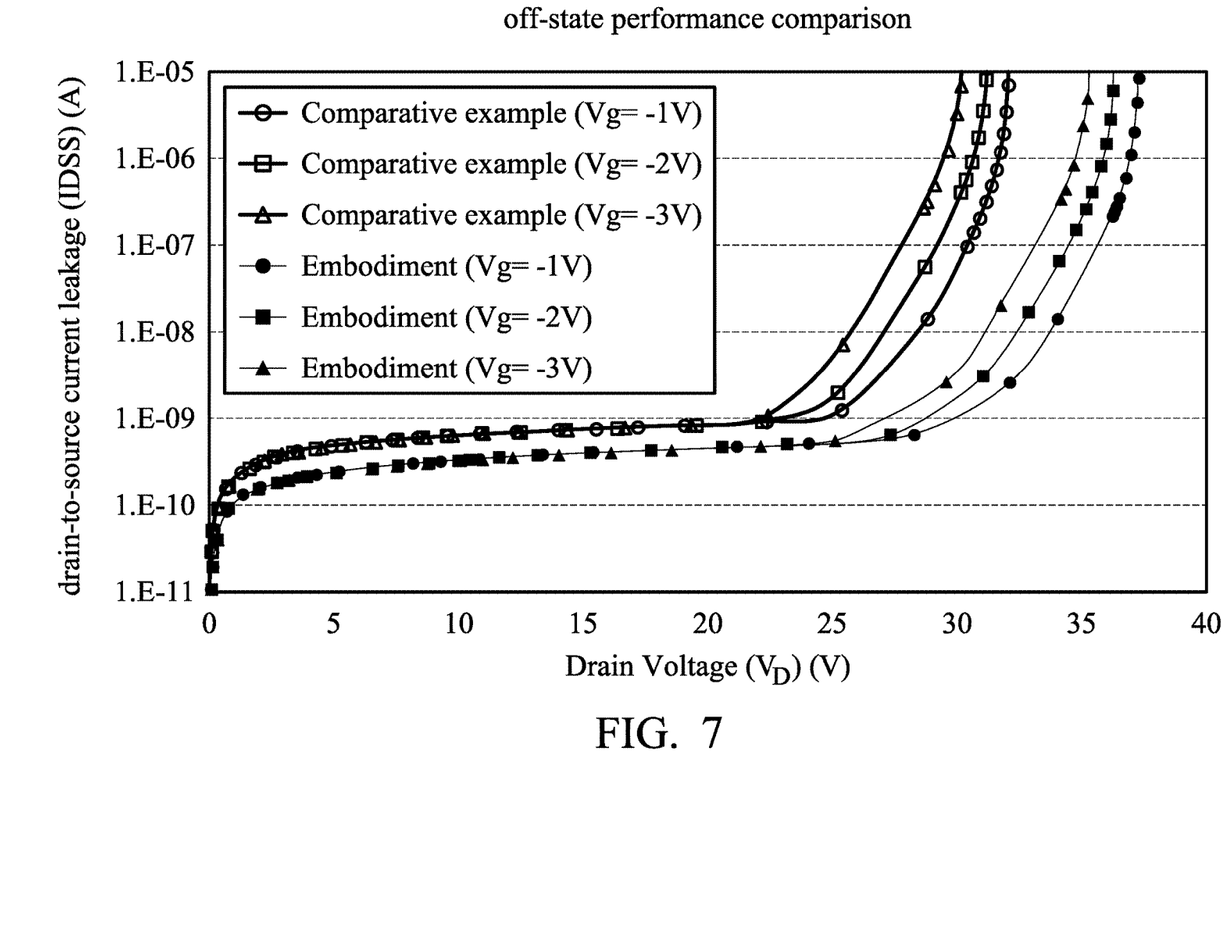
FIG. 7 shows another electrical test chart of a semiconductor device according to some embodiments of the disclosure.

FIGS. 5-7 show electrical test charts of the semiconductor device 100 having the Trench MOSFET according to some embodiments of the disclosure. However, the embodiments of the disclosure should not be limited to any specific application. In FIGS. 5-7, an embodiment of the semiconductor device 100 is fabricated by forming the first doping region 103 and the second doping region 104 in the epitaxial layer 102 at first, and then forming the trench 106 penetrating the epitaxial layer 102, the first doping region 103 and the second doping region 104 of the semiconductor device 100. In FIGS. 5-7, a comparative example of another semiconductor device is fabricated by forming the trench 106 in the epitaxial layer 102 at first, and then forming the first doping region 104 and the second doping region 104 in the epitaxial layer 102 through the trench 106.

As shown in FIG. 5, the semiconductor device of the embodiment has a greater breakdown voltage than the breakdown voltage of the comparative example while the semiconductor device of the embodiment has the same doping dose for the well region as that of the comparative example. As shown in FIG. 6, the semiconductor device of the embodiment has a greater breakdown voltage than the breakdown voltage of the comparative example while the semiconductor device of the embodiment has the same drain-source on-state resistance (Rdson) as that of the comparative example. It proves that since the semiconductor device of the embodiment is fabricated by forming the first doping region 103 and the second doping region 104 in the epitaxial layer 102 at first, and then forming the trench 106 penetrating the epitaxial layer 102, the first doping region 103 and the second doping region 104, the doping profiles and the doping concentrations of the first doping region 103 and the second doping region 104 of the embodiment have better distribution effect. The semiconductor device of the embodiment having the Trench MOSFET is thereby having a better and higher breakdown voltage. Compared to the comparative example, in some embodiments of the disclosure, the breakdown voltage of the semiconductor device can be increased by about 13%.

FIG. 7 shows the off-state performance comparison of the semiconductor devices of the embodiment of the disclosure and the comparative example. In different gate voltages ($V_g$), compared to the semiconductor device of the comparative example reaches the breakdown voltage at the drain voltage ($V_D$) of about greater than 22V, the semiconductor device of the embodiment reaches the breakdown voltage at the drain voltage of about greater than 25V. Therefore, the semiconductor device of the embodiment has a higher breakdown voltage. Furthermore, as shown in FIG. 7, compared to the semiconductor device of the comparative example, the semiconductor device of the embodiment has a smaller saturated drain-to-source current leakage (IDSS), or so called a saturated current. Compared to the comparative example, in some embodiments of the disclosure, the IDSS of the semiconductor device can be decreased by about 30%.

According to some embodiments of the disclosure, since the first doping region is disposed in the epitaxial layer and has the second conductivity type, which is different from the conductivity type of the substrate and the epitaxial layer, the charges of two different conductivity types are balanced in the epitaxial layer, and further make a semiconductor device that has a Trench MOSFET with a high breakdown voltage. In other words, the first doping region improves the withstand voltage of the semiconductor device.

In addition, since the length of the channel region of the Trench MOSFET is proportional to the drain-source on-state resistance (Rdson) of the semiconductor device having the Trench MOSFET, by adjusting the conductivity type and disposition of the second doping region near the well region, the length of the channel region of the Trench MOSFET can be influenced and controlled, thereby the Rdson of the Trench MOSFET can be decreased further.

Furthermore, according to some embodiments of the disclosure, since the process step of forming the semiconductor device are performed by forming the first doping region and the second doping region in the epitaxial layer at first and then forming the trench penetrating the epitaxial layer, the first doping region and the second doping region, the doping profiles and the doping concentrations of the first doping region and the second doping region formed in the epitaxial layer are not influenced by the shielding effect of the trench, and the first doping region and the second doping region can be distributed evenly on two opposite sidewalls of the trench. The semiconductor device having the Trench MOSFET of the embodiments is thereby having a better and higher breakdown voltage and a smaller saturated drain-to-source current leakage (IDSS). Therefore, the semiconductor device has a higher figure of merit (FOM).

The semiconductor devices and methods for fabricating the same according to the embodiments of the disclosure can be applied to high electron mobility transistors (HEMT), insulated gate bipolar transistors (IGBT) or other low-voltage elements, high-voltage elements, and extreme high-voltage elements.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
   a substrate having a first conductivity type;
   an epitaxial layer having the first conductivity type disposed on the substrate and having a trench therein;
   a polysilicon layer filling the trench and having the first conductivity type; and
   a first doping region disposed in the epitaxial layer and located on sidewalls of the trench and having a second conductivity type that is different from the first conductivity type, wherein the first doping region is an annular region continuously surrounding the trench in a top view.

2. The semiconductor device of claim 1, further comprising:
   a well region disposed on the epitaxial layer and having the second conductivity type; and
   a heavily doped region disposed on the well region and having the first conductivity type, wherein the trench extends from the epitaxial layer to the well region and the heavily doped region, and wherein the heavily doped region, the substrate, the well region and the polysilicon layer are used as a source, a drain, a channel region and a gate of the semiconductor device, respectively.

3. The semiconductor device of claim 1, further comprising a second doping region disposed in the epitaxial layer and located on the sidewalls of the trench, and the second doping region is located over the first doping region and separated from the first doping region by a distance.

4. The semiconductor device of claim 3, wherein the second doping region has a doping concentration, a dopant, a doping area or a conductivity type that is different from that of the first doping region.

5. The semiconductor device of claim 3, wherein the second doping region has a doping concentration, a dopant, a doping area or a conductivity type the same as that of the first doping region.

6. The semiconductor device of claim 2, further comprising a reduced surface field (RESURF) doping region disposed in the epitaxial layer and located under the well region, and the RESURF doping region is separated from the trench and has the second conductivity type.

7. The semiconductor device of claim 2, further comprising an oxide liner layer disposed on the heavily doped region and extending onto the sidewalls and the bottom of the trench, wherein the oxide liner layer is between the polysilicon layer and the epitaxial layer.

8. The semiconductor device of claim 6, further comprising a dielectric layer disposed over the heavily doped region and having an opening corresponding to the RESURF doping region, wherein the opening further extends into the heavily doped region and the well region.

9. The semiconductor device of claim 8, further comprising a metal layer disposed on the dielectric layer and filling the opening.

10. The semiconductor device of claim 9, wherein the metal layer in the opening is used as the bulk of the semiconductor device.

11. A method for fabricating a semiconductor device, wherein the semiconductor device comprises:
    a substrate having a first conductivity type;
    an epitaxial layer having the first conductivity type disposed on the substrate and having a trench therein;
    a polysilicon layer filling the trench and having the first conductivity type; and
    a first doping region disposed in the epitaxial layer and located on sidewalls of the trench and having a second conductivity type that is different from the first conductivity type, wherein the first doping region is an annular region continuously surrounding the trench in a top view,
    the method comprising:
    providing the substrate having the first conductivity type;

forming the epitaxial layer having the first conductivity type on the substrate;

forming a patterned mask having a first opening on the epitaxial layer;

performing an ion implantation process on the epitaxial layer through the first opening to form the first doping region having the second conductivity type in the epitaxial layer;

after forming the first doping region, performing an etching process on the epitaxial layer through the first opening to form the trench in the epitaxial layer and the first doping region, wherein a remaining portion of the first doping region is located on sidewalls of the trench; and filling the polysilicon layer having the first conductivity type into the trench.

12. The method of claim 11, further comprising forming a second doping region over the first doping region before forming the trench, wherein the second doping region is separated from the first doping region by a distance, and the etching process also removes a portion of the second doping region leaving a remaining portion of the second doping region located on the sidewalls of the trench.

13. The method of claim 12, wherein the first doping region and the second doping region are respectively formed by two different ion implantation processes in two different steps.

14. The method of claim 11, further comprising:

forming a well region having the second conductivity type in the epitaxial layer; and forming a heavily doped region having the first conductivity type on the well region, wherein the trench penetrates the well region and the heavily doped region.

15. The method of claim 14, further comprising forming an oxide liner layer on the heavily doped region, wherein the oxide liner layer extends onto the sidewalls and the bottom of the trench.

16. The method of claim 14, further comprising:

forming a reduced surface field (RESURF) doping region in the epitaxial layer and under the well region, wherein the RESURF doping region is separated from the trench and has the second conductivity type.

17. The method of claim 16, further comprising:

forming a dielectric layer over the heavily doped region, and forming a second opening in the dielectric layer, the well region and the heavily doped region, wherein the second opening corresponds to the location of the RESURF doping region; and forming a metal layer on the dielectric layer, wherein the metal layer fills the second opening.

* * * * *